United States Patent [19]
MacGregor

[11] 3,932,816
[45] Jan. 13, 1976

[54] MULTIFREQUENCY DRIVE CLOCK

[75] Inventor: William W. MacGregor, Wellesley Hills, Mass.

[73] Assignee: Honeywell Information Systems, Inc., Waltham, Mass.

[22] Filed: Dec. 13, 1974

[21] Appl. No.: 532,670

[52] U.S. Cl. ................. 328/61; 307/243; 307/271; 328/63; 328/154; 331/49
[51] Int. Cl.² ..................... H03K 1/17; H03B 5/36
[58] Field of Search ...... 307/242, 243, 271; 328/61, 328/63, 154; 331/49

[56] References Cited
UNITED STATES PATENTS

| | | | |
|---|---|---|---|
| 3,029,389 | 4/1962 | Morphet, Jr. | 331/49 |
| 3,226,648 | 12/1965 | Davidson | 328/63 |
| 3,290,606 | 12/1966 | Rodner | 307/269 |
| 3,593,158 | 7/1971 | Day et al. | 328/63 |
| 3,594,656 | 7/1971 | Tsukamoto | 328/63 |
| 3,764,992 | 10/1973 | Milne | 328/63 |
| 3,777,277 | 12/1973 | Naber | 331/49 |

*Primary Examiner*—Stanley D. Miller, Jr.
*Attorney, Agent, or Firm*—R. T. Reiling; D. A. Frank

[57] ABSTRACT

Apparatus for selectively producing at a single output terminal one of a plurality of pulse repetition frequencies (PRF) in response to a set of control signals. After decoding the control signals, the apparatus contains networks for delaying and gating affected clock drive pulse repetition frequencies. Apparatus output is a train of pulses whose PRF varies from time to time, but within a relatively narrow spectrum, under control of the decoded control signals. Such output signals are particularly useful for driving logical components in a computer system with highly specialized and sensitive system specifications.

8 Claims, 6 Drawing Figures

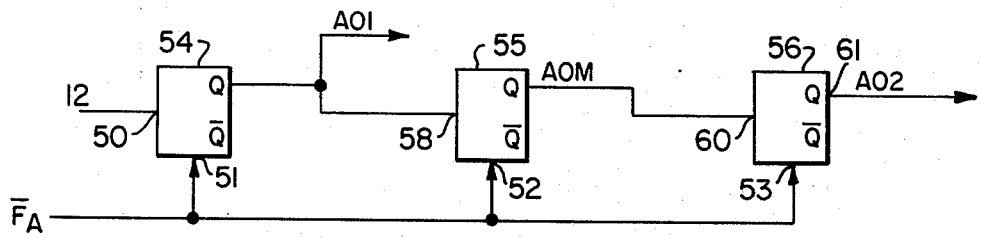
FIG. 3A
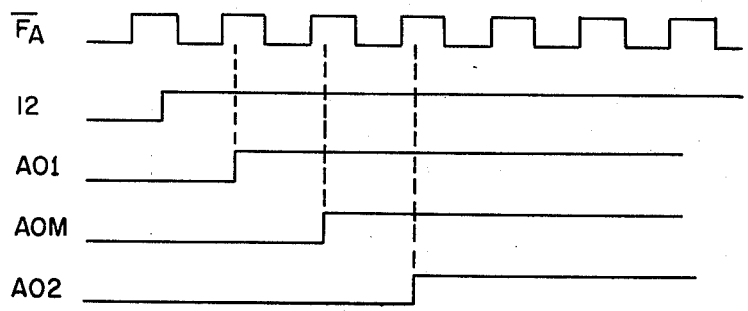
FIG. 3B
FIG. 3C

MULTIFREQUENCY DRIVE CLOCK

BACKGROUND OF THE INVENTION

1. Field of the Invention

The invention relates generally to apparatus for producing clock drive signals and in particular to apparatus for selectively producing one clock drive frequency from a plurality of frequencies for driving logical components with different timing requirements but within a common computer system.

2. Description of the Prior Art

Modern data processing systems include a plurality of subsystems and/or a plurality of different types and generations of peripheral devices. The operation of the subsystems and the peripherals is often asynchronous with respect to a central processing unit (CPU). Typically, a cluster of peripheral devices are controlled and driven by a common control unit which may be connected directly to the CPU or may be more likely connected indirectly to the CPU by means of a peripheral control unit (PCU). In either event, the control unit operates asynchronously from a CPU (and/or the PCU).

Despite the general asynchronous operation of the control unit and its associated peripheral devices, the CPU nonetheless imposes system timing requirements on the operation of the control unit in the driving of the peripherals. Consequently, drive clocks for driving peripheral units (typically contained within the control unit) have to be built to satisfy two divergent, though non-conflicting, sets of parameters. First, the drive frequency for controlling the operation of a specific peripheral unit has to be the frequency which matches the timing requirements of the peripheral unit. Secondly, the initialization and termination of the drive frequency has to be coordinated with the master system clock so as to properly communicate with other system apparati.

Typical prior art solutions to this problem involved building a drive clock on a printed circuit board, and including the drive clock in a magnetic tape controller (MTC). The MTC was then coupled to a plurality of tape drives with identical drive frequency requirements. Control of the single-frequency clock drive was coordinated with the master system clock to assure satisfaction of the system timing requirements.

The problem was complicated, however, by the evolution of new peripheral units with slightly different drive frequency requirements from older versions of similar components. (An example is the evolution of tape drives). Prior art solutions to this problem required attaching only peripheral devices with identical timing requirements to any single-frequency control unit. This required building different control units capable of emitting different drive frequencies for each set of peripheral devices with different timing requirements. However, it is clearly desirable to have control units capable of driving components with different timing requirements, thereby obtaining much greater flexibility and interchangeability of system components.

The overall system timing requirements include the following limitations. First, a pulse train of the desired frequency must begin with a full-width pulse. Secondly, each of the pulse trains must also end with a full-width pulse. Thirdly, the delay or gap between pulse trains of different frequencies must be greater than or equal to the slowest (or widest) pulse width spacing. Meeting these system requirements is essential for coordination with the master system clock while operating asynchronously to it. Meeting these specifications and simultaneously selectively choosing between a variety of pulse trains with different frequencies poses a compounded problem. Prior art methods of producing a plurality of clock pulses with different frequencies includes providing a plurality of freerunning drive clocks. However, the different frequencies of these free-running clocks necessarily implies a continually changing phase relationship between the pulse trains which makes the task of meeting the system requirement much more complex.

OBJECTS OF THE INVENTION

It is an object of the present invention therefore to provide a multifrequency drive clock logically responsive to a set of control signals.

It is a further object of the invention to provide a multifrequency drive clock which is capable of driving a plurality of logical units, each with different timing requirements within the system requirements of an asynchronous data processing system.

It is another object of the present invention to provide an apparatus for selectively producing one of a plurality of drive clock frequencies within the system timing requirements of an asynchronously operating data processing system.

Other objects of the invention will become readily apparent when read in conjunction with the drawings contained herein.

SUMMARY OF THE INVENTION

The apparatus of the invention receives externally generated control signals which contain coded information directing the choice of which output drive frequency and/or peripheral units is desired. The control signals are passed through a decoding network which selectively signals one of the mutually exclusive drive clocks to become operational, and another of the mutually exclusive operational clocks to become non-operational. The apparatus contains a plurality of delay chain circuits, one for each of the possible output drive clocks. The delay train circuit for the frequency which is to become non-operational delays the decoded signal such that the pulse train is turned off after completion of a complete pulse width. The delay train circuit for the frequency which is to be turned on delays another decoded signal such that there will be suitable delay between pulse trains and that the beginning of the new pulse train will start with a complete pulse width. The output of each of the delayed trains and each of the drive clocks pass through a buffering network which contains a plurality of logic gates which allows only one of the clock frequencies to be passed through as an output signal. In this manner, a plurality of clock frequencies may result as output from the multidrive clock in response to a series of control signals.

BRIEF DESCRIPTION OF THE DRAWINGS

FIG. 3A is a diagram of one of the delay chain circuits shown in FIG. 1. FIGS. 3B and 3C are timing waveform diagrams associated with the operation of FIG. 3A.

BRIEF DESCRIPTION OF THE PREFERRED EMBODIMENT

Figure 1:
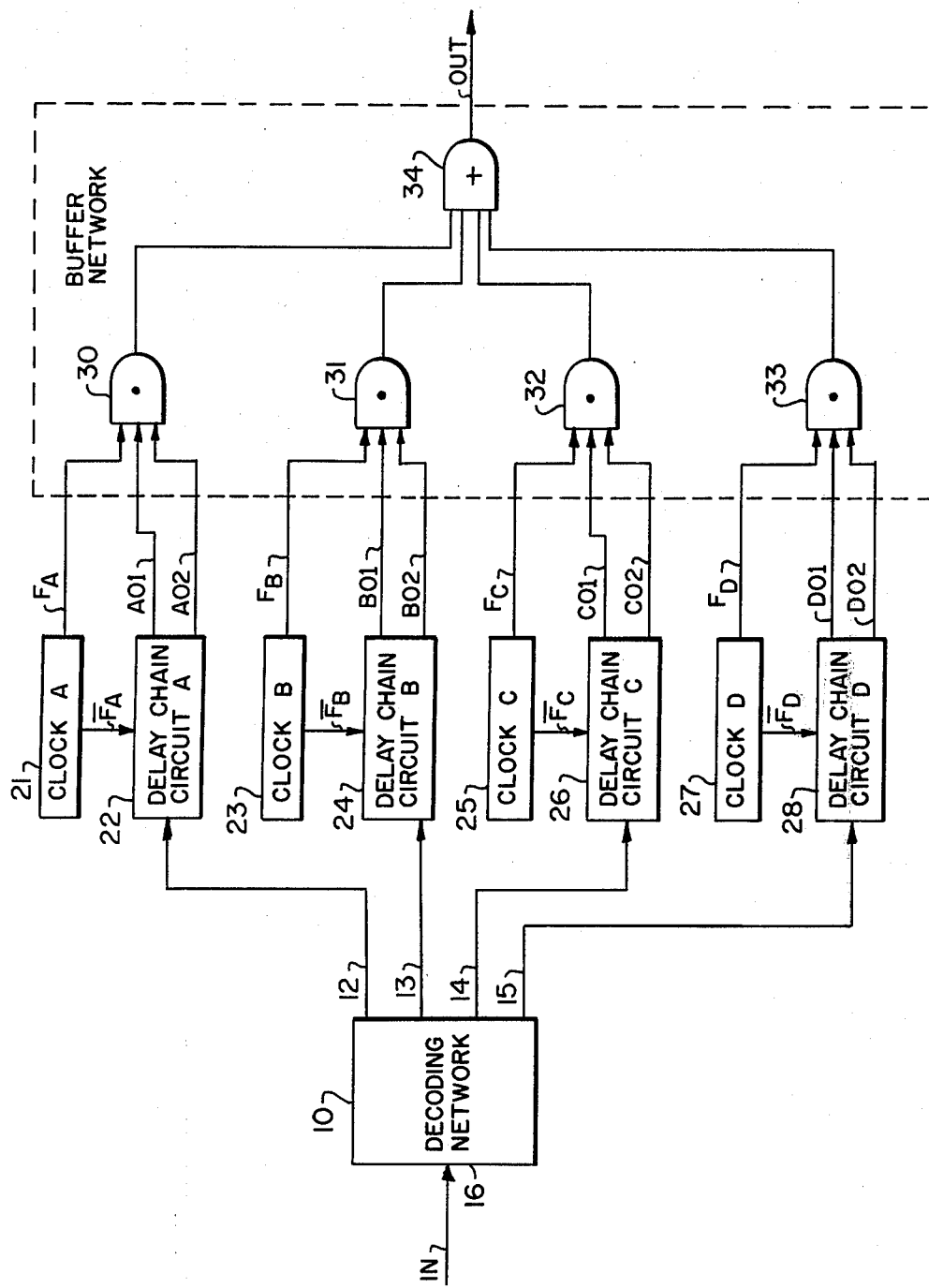
FIG. 1 is a block diagram of the apparatus according to the invention.

Referring now to FIG. 1, the apparatus of the invention is shown in block diagram form. Input control signals IN are connected to input terminal 16 of a decoding network 10. Although shown as a single line, the input signals IN may be passed through a plurality of wires. Decoding network 10 could be any standard one-of-two, one-of-four, or, in general, one-of N decoding network for converting coded input signals into a single signal on one of the N output lines of the decoding network. In the preferred embodiment, decoding network 10 is a one of four decoder. (Those of ordinary skill in the art will readily recognize how the invention can be modified to utilize a one-of-N decoder.) Output wires from decoding network 10 are lines 12, 13, 14, 15. Since the decoding network 10 is a one-of-four decoder, only one of the four output lines 12, 13, 14, 15 carry a positive output signal at any one time. The decoding network must therefore assure that there is relative timing synchronization between the changing of signals sent over output lines 12, 13, 14, 15.

Line 12 is connected to an input terminal of delay chain circuit A, block 22, which is associated with clock circuit A, block 21. Similarly, line 13 is connected to an input terminal of delay chain circuit B, block 24, line 14 is connected to an input terminal of delay chain circuit C, block 26, and line 15 is connected to an input terminal of delay chain circuit D, block 28, each of which is associated with the commonly labelled clock circuit, blocks 23, 25, 27 respectively. Before continuing with the description of FIG. 1, it is desirable to describe clock circuits A, B, C, D and delay chain circuits A, B, C, D.

Figure 2:
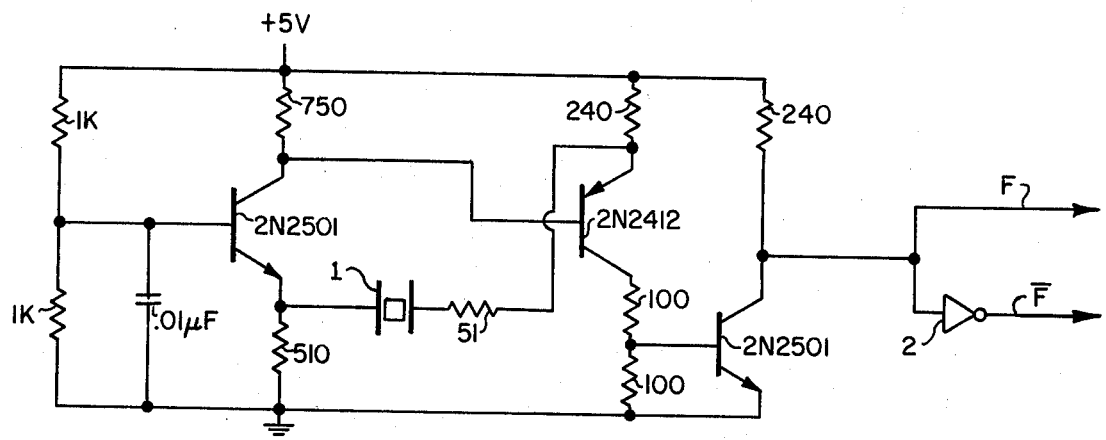
FIG. 2 is a diagram of one of the single frequency clock circuits shown in FIG. 1.

Referring to FIG. 2, a clock circuit for producing a single frequency is shown with appropriate values and interconnections. (Each of the resistive values is in ohms and the transistor numbers correspond to conventional trade numbers.) The characteristics of crystal 1 determine the drive frequency emitted by the circuit. Since four frequencies are considered in the preferred embodiment, four typical crystal frequencies for tape drives would be as follows:

4.800000 Mhz ± 0.005 percent
4.583333 Mhz ± 0.005 percent
4.704000 Mhz ± 0.005 percent
4.607999 Mhz ± 0.005 percent Therefore the circuit shown in FIG. 2 corresponds to clocks A, B, C, and D (block 21, 23, 25, 27 respectively in FIG. 1). Each of clocks A, B, C, D would have one of the above-mentioned crystal frequencies. It should be noted that these frequencies, although different, are within a relatively narrow spectrum. NAND-gate 2 causes a slight delay in the generation of the inverted clock signal $\overline{F}$ with respect to the primary signal F, although there is a constant phase difference between the two outputs F and $\overline{F}$ of each of the circuits.

Referring now to FIGS 3, delay chain circuit A (block 22 in FIG. 1) and the time-relationship of various pulses for clock A and delay chain circuit A are shown. (It should be noted that delay chain circuits B, C, D are identical to delay chain circuit A (except for the crystal frequency) and have the same time-relationships between corresponding pulses.) In FIG. 3A, flip-flops 54, 55, 56 are all D-type flip-flops. The clock inputs 51, 52, 53 of the three flip-flops are commonly connected to clock signals $\overline{F}_A$. The input 50 of the delay chain circuit A receives a signal over line 12 from the decoding network. The positive output 57 of flip-flop 54 sends a signal called A01 and is connected to input 58 of flip-flop 55. The positive output 59 of flip-flop 55 sends a signal called AOM and is connected to input 60 of flip-flop 56. Positive output 61 of flip-flop 56 is the output terminal for delay chain circuit A and sends a signal called A02.

FIGS. 3B and 3C show the timing relationships between the various signals for setting or resetting flip-flops 54, 55, 56. The D-type flip-flops selected for use change state only upon detecting the rising front edge of a clock pulse. The serial linkage of the flip-flops 54, 55, 56 causes a delay in the propagation of a signal through the delay chain circuit, i.e., a delay in passing a signal from line 12 to output lines A01 and A02. As can be seen in FIG. 3B, clock $\overline{F}_A$ is free-running. The raising of a signal on line 12 results in the raising of signal A01 upon the detection of the rising front edge of a clock signal at clock input 51 of flip-flop 54. Similarly, one cycle later, signal A0M is raised and two cycles later A02 is raised. Also similarly, FIG. 3C shows the delay between the turning off of an input signal on line 12 and the turning off of delay chain signals A01, A0M, A02.

Referring back to FIG. 1, buffer network logic is shown. Input terminals of AND-gate 30 are connected to clock A to receive clock signals $F_A$ and to delay chain circuit A to receive signals A01 and A02. Similarly, AND-gate 31 receives signals $F_B$, B01, B02; AND-gate 32 receives signals $F_C$, C01, C02; and AND-gate 33 receives signals $F_D$, D01, D02. The output terminal of each of the AND-gates 30, 31, 32, 33 is connected to an input terminal of OR-gate 34. From the output terminal of OR-gate 34, the desired clock signal called OUT is sent.

Figure 4:
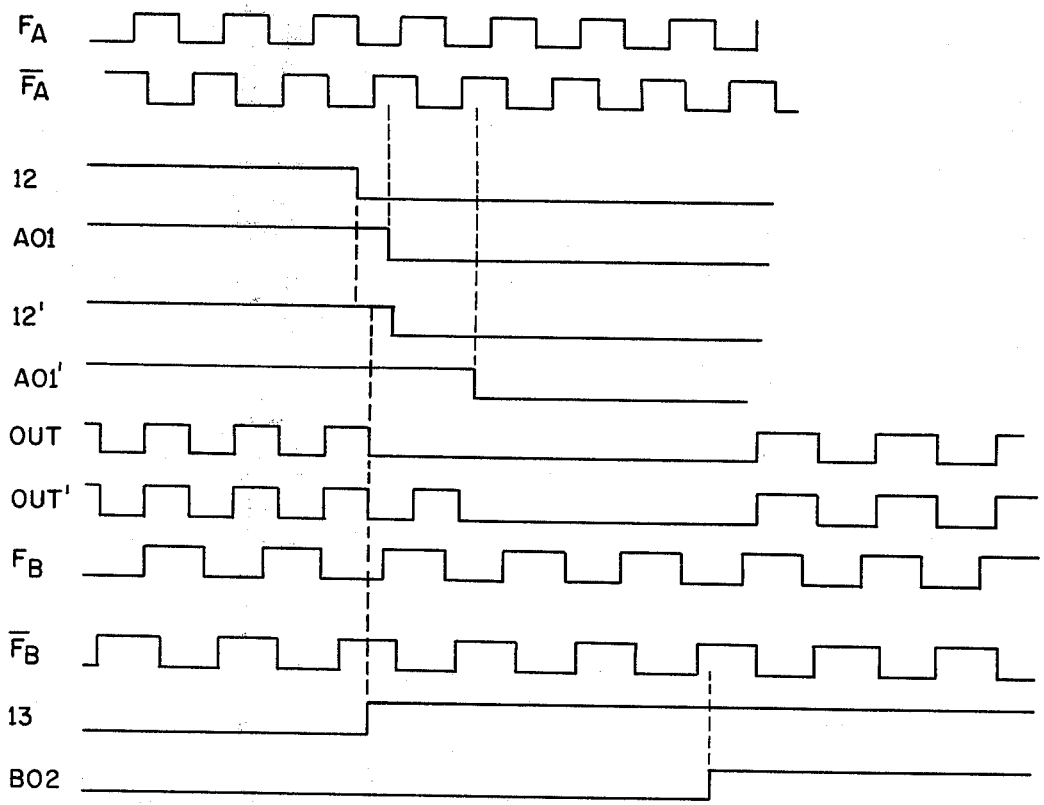
FIG. 4 shows the timing relationship between pulses of interest within the apparatus.

Referring now to FIG. 4, timing relationships between signals for changing from drive clock A to drive clock B are shown. It is assumed that the input control signal IN has been decoded by the decoding network 10, and that the desired result is for clock A to be turned off and clock B to be turned on.

Before decoding network 10 changes the signal on line 12 to low and the signal on line 13 to high, the output signal OUT from the apparatus corresponds to clock A. (Actually OUT has a constant lag in phase relationship to $F_A$ due to AND-gate 30 and OR-gate 34). When line 12 goes low, signal A01 will follow it upon detection of the rising front edge of a clock signal $\overline{F}_A$. The falling of signal A01 causes the output from AND-gate 30 to fall and, in turn, remove clock A from passing to output. It should be noted that use of $\overline{F}_A$ as the clock signal for the flip-flops of delay chain circuit A assures that clock A is turned OFF after completion of an entire pulse width. (Similarly, use of $\overline{F}_B$ assures that clock B is turned on at the beginning of a pulse so as to produce a complete pulse width.) Signal A02 is not shown since it is of interest only when changing to pass clock A to output, not when changing to remove clock A from passing to output.

The signal on line 13 goes high in approximate simultaneity with line 12 going low. (Differences from this assumption are discussed below.) Due to delay chain circuit B, signal B02 goes high upon receipt of the third rising front from clock circuit $\overline{F}_B$. (Signal B01 is not shown since it is not of critical interest only for removing clock B from passing to output.) Consequently, signal OUT effectively becomes clock signal $F_B$ (with slight delay and phase difference). The apparatus will continue to operate in this state until a new control signal is received by the apparatus.

Clock B is not turned on until one or two cycles after clock A is turned off. Clearly, there must be a one-cycle delay or else there would be an overlap of pulses which would be in conflict of the system specifications. However, an additional cycle delay is imposed by the delay chain circuits so as to avoid any problems of possible "slippage" between pulses due to less than idealistic performance of apparatus elements, particularly the decoding network. It was assumed that line 12 goes low and line 13 goes high at the same instant. However, in practice, there may be a 7 to 10 nanosecond difference between these changes. This delay may cause this slippage between pulses, thereby causing clock A not to go off on the first cycle (with respect to clock B) but on the second cycle. This is best explained with reference to lines 12 and A01 of FIG. 4.

The signal over line 12' falls slightly after the signal on line 13 rises. If the rising front of clock signal $\overline{F}_A$ occurs within this delay period (as in FIG. 4), delay chain circuit A "misses" one rising front which it has been assumed to receive.

System specifications often require spacing between pulse trains of different frequencies to be greater than a minimum amount. Therefore, overlap of clock pulses, which would occur due to slippage, fails to satisfy system requirements, whereas excessive spacing poses no problem. Consequently, the apparatus imposes a three-cycle delay to assure that such slippage will not interfere with obtaining clean, non-interferring pulses from the buffer network and over output line OUT'.

Those of ordinary skill in the art will recognize other embodiments of the present invention. It is readily apparent that although the preferred embodiment shows a "quad-frequency" drive clock, the invention teaches a multi-frequency drive clock. Furthermore, although the use of such a multi-frequency drive clock is of particular utility in the case of driving peripheral units such as tape drives in a data processing system, other uses both within and without a computer environment are contemplated.

What is claimed is:

1. Apparatus for selectively generating at a single output terminal one of a plurality of clock drive frequencies in response to a control signal comprising:

decoding means responsive to said control signal for generating decoded signals over a plurality of decode output lines;

a plurality of clock circuits, each of said clock circuits generating a first and a second clock pulse train, said second clock pulse train being substantially the negation of said first clock pulse train;

a plurality of delaying means corresponding to said clock circuits, each of said delaying means responsive to one of said second clock pulse trains and coupled to a respective one of said decode output lines for generating delayed signals; and logical selection means coupled to each of said clock circuits for receiving said first clock pulse trains, said selection means responsive to said delayed signals for selectively passing one of said first clock pulse trains to said output terminal.

2. Apparatus as claimed in claim 1 wherein said plurality of first clock pulse trains are within a relatively narrow band of frequencies.

3. Apparatus as recited in claim 1 wherein said delay chain means comprises three serially connected flip-flops.

4. Apparatus as recited in claim 1 wherein said logical selection means comprises:

a plurality of AND-gates, each of said AND-gates coupled to a respective one of said delaying means to receive said delayed signals, each of said AND-gates also coupled to a corresponding one of said clock circuits for receiving a first clock pulse train; and OR-gating means responsive to the output signals of said AND-gate, output signals of said OR-gating means coupled to said output terminal.

5. Apparatus for generating one of a plurality of clock drive frequencies comprising:

a plurality of clock circuits, a plurality of input terminals for receiving mutually exclusive control signals, logical means coupled to said clock circuits and responsive to delayed control signals for selectively passing signals from one of said clock circuits to an apparatus output terminal; and a plurality of delay means each coupled to a respective one of said input terminals and responsive to signals from one of said clock circuits, said delaying means coupled to said logical means for sending said delayed control signals to said logical means.

6. Apparatus as claimed in claim 5 wherein said delay means comprises a plurality of flip-flops interconnected in series.

7. Apparatus as claimed in claim 6 wherein said clock circuits each generate a first pulse train of a different frequency and a second pulse train which is the inverse of said first pulse train, said frequencies being within a narrow spectrum of frequencies.

8. Apparatus as claimed in claim 7 wherein clock input terminals of said flip-flops receive signals from said second pulse trains and said logical means receive said first pulse train signals from said clock circuits.

* * * * *